United States Patent
Hu et al.

(10) Patent No.: US 7,095,111 B2
(45) Date of Patent: Aug. 22, 2006

(54) PACKAGE WITH INTEGRATED WICK LAYER AND METHOD FOR HEAT REMOVAL

(75) Inventors: Chuan Hu, Chandler, AZ (US); Richard D. Emery, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 323 days.

(21) Appl. No.: 10/403,645

(22) Filed: Mar. 31, 2003

(65) Prior Publication Data

US 2004/0188829 A1 Sep. 30, 2004

(51) Int. Cl.
*H01L 23/34* (2006.01)

(52) U.S. Cl. ..................................................... 257/714

(58) Field of Classification Search ................. 502/345, 502/208; 428/614; 361/234; 257/714, 713, 257/712; 164/98; 29/527.6
See application file for complete search history.

(56) References Cited

U.S. PATENT DOCUMENTS 5,780,928 A * 7/1998 Rostoker et al. ............ 257/713

OTHER PUBLICATIONS

Bakir, M S., et al., "Sea of leads ultra high–density compliant wafer–level packaging technology", *52nd Electronic Components and Technology Conference 2002*, (May 31, 2002), 1087–94.

Ma, Lunyu, et al., "J–Springs—innovative compliant interconnects for next–generation packaging", *52nd Electronic Components and Technology Conference 2002*, (May 31, 2002), 1359–65.

Rosenfeld, John H., et al., "Internally extended surface heat pipe evaporators for microelectronics cooling", *Fundamentals of phase change—boiling and condensation : presented at the 6th AIAA/ASME Thermophysics and Heat Transfer Conference*, Colorado Springs, Colorado, Jun. 20–23, 1994 /, (1994), 93–100.

Yusuf, I, et al., "Integrated heat sink—heat pipe thermal cooling device", *ITHERM 2000. The Seventh Intersociety Conference on Thermal and Thermomechanical Phenomena in Electronic Systems*, (May 23–26, 2000), 27–30.

* cited by examiner

*Primary Examiner*—Carl Whitehead, Jr.
*Assistant Examiner*—Monica D. Harrison
(74) *Attorney, Agent, or Firm*—Schwegman, Lundberg, Woessner & Kluth, P.A.

(57) ABSTRACT

A package for a die includes a porous wick layer disposed between the die and a substrate. A sealed chamber between the die and substrate includes a phase-change fluid to transfer heat from a substrate side of the die to a heat spreader. Interconnects coupling bonding pads of the die to the substrate may pass through the chamber and through vias in the wick layer. In embodiments, the wick layer may have a coefficient of thermal expansion (CTE) matching a CTE of the die of the heat spreader. Heat generated by the die may evaporate the fluid in a die region and the evaporated fluid may condense in a heat spreader region. The wick layer returns the condensed fluid from the heat spreader region to the die region to complete the cycle. The fluid may be non-corrosive with respect to the interconnects and may be an electrical insulator. In embodiments, the wick layer in the heat spreader region may be disposed on the heat spreader in a pattern to efficiently draw the condensed fluid to the die region. In other embodiments, the wick layer may comprise materials of different pore size and porosity to efficiently draw the condensed fluid to the die region.

19 Claims, 6 Drawing Sheets

PACKAGE WITH INTEGRATED WICK LAYER AND METHOD FOR HEAT REMOVAL

TECHNICAL FIELD

The present invention pertains to packages for microelectronic die, and in some embodiments, to package structures suitable for higher power microelectronic die including processors and graphics chips.

BACKGROUND

As semiconductor devices, such as processors and processing elements, operate at continually higher data rates and higher frequencies, greater current is consumed and more heat is produced. Due to size and location restrictions, as well as thermal limitations, conventional heat transfer mechanisms for packaged devices (i.e., dies) have a limited heat transfer capability restricting the operation of such devices to lower power levels, lower data rates and/or lower operating frequencies. As the performance of dies increases, materials with lower dielectric constants may be integrated into the die surface. These lower dielectric materials tend to be either more brittle or less stiff than those used previously, and may break more easily or deform by large amounts as a result of thermal expansion mismatches between the various materials in the package.

One problem with conventional packages is the heat dissipation path itself. Some conventional packaging techniques dissipate heat generated within a die using an integrated heat spreader which may be thermally bonded to the side of the die opposite the substrate. In many cases, however, most of the heat generated within the die is generated on the substrate side of the die, rather than the heat spreader side of the die. This increased heat dissipation path reduces the heat dissipation ability of the package. It may also increase the operating temperature of the die, and may restrict the operation of the die to lower power levels, lower data rates and/or lower operating frequencies.

Another problem with conventional organic-based packages is the thermal expansion mismatch between the die and the substrate. This is especially a problem for die coated with lower dielectric constant materials. Conventional packaging techniques have used a ceramic, rather than organic, substrate to reduce the thermal expansion mismatch. More recently, interconnects have been introduced between the substrate and die that reduce the thermal stresses on the die and the dielectric layer. These interconnects are sometimes referred to as "compliant" interconnects because they may comply with their surroundings. Although these interconnects may reduce the thermal stresses on the die, they have poor heat dissipation abilities making it difficult to remove heat from the substrate side of the die where most heat may be generated.

Thus, there are general needs for improved packages and methods for dissipating heat within a package. There is also a need for a package and method that helps reduce the temperature of a die. There is also a need for a package and method that removes heat from the substrate side of a die. There is also a need for a package and method that helps reduce stress on a die caused by thermal mismatches. There is also a need for a package and method that increases the reliability of a die. There is also a need for a package and method that allows a die to operate at higher data rates. There is also a need for a package and method suitable for die incorporating lower dielectric constant materials.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the full ambit of the claims and all available equivalents of those claims.

In embodiments, the present invention provides an improved package and method. In embodiments, a package and method may help reduce the temperature of a die. In embodiments, a package and method may help reduce stress on a die caused by thermal expansion mismatches. In embodiments, a package and method may increase the reliability of a die. In embodiments, a package and method may allow a die to operate at higher data rates. In embodiments, a package and method may help reduce the temperature of higher power die. In embodiments, a package and method may be suitable for a die incorporating lower dielectric constant materials. In embodiments, a package may include a wick layer between a die and a substrate, and a sealed chamber with a phase change fluid therein. The phase-change fluid may transfer heat from a substrate side of the die to a heat spreader. In embodiments which use compliant interconnects, the compliance of such interconnects is generally not degraded by the wick layer making these embodiments suitable for packaging fragile die.

Figure 1:
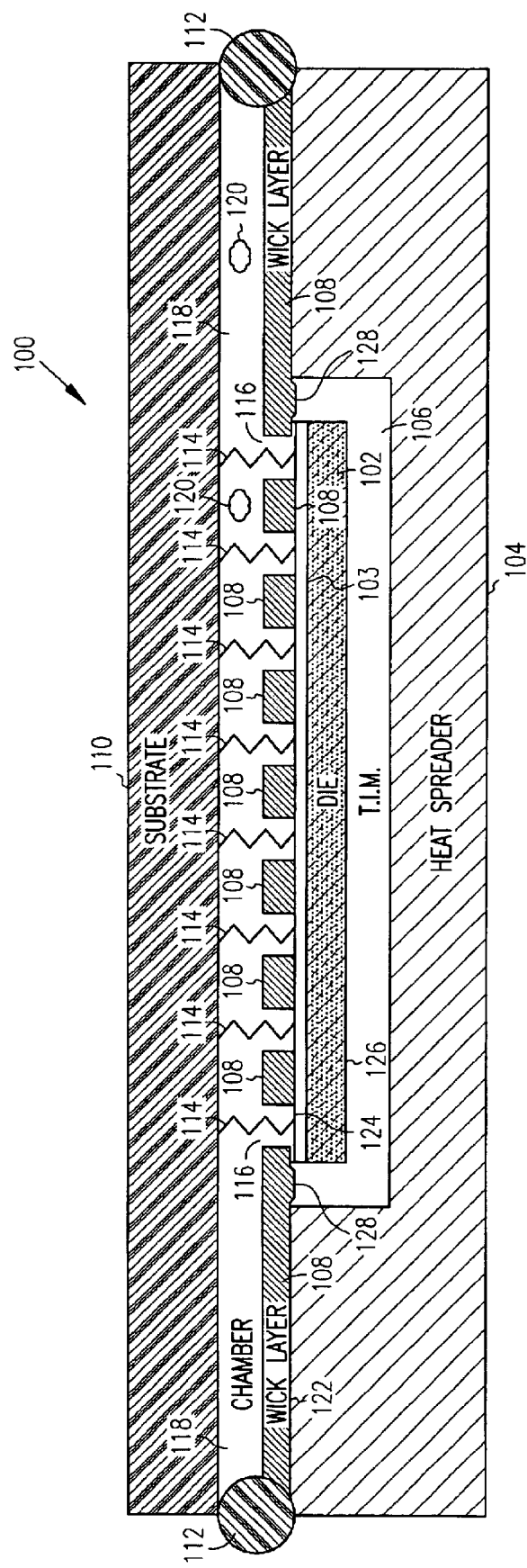
FIG. 1 is cross-sectional view of package in accordance with embodiments of the present invention.

FIG. 1 is cross-sectional view of package in accordance with an embodiment of the present invention. Package 100 includes die 102 and heat spreader 104 coupled with substrate 110. Package 100 also includes porous wick layer 108 disposed between die 102 and substrate 110. Sealed chamber 118 between substrate 110 and die 102 includes phase-change fluid 120 which may transfer heat from substrate side 124 of die 102 to heat spreader 104. Interconnects 114 may couple bonding pads of the die 102 to substrate 110. Bonding pads 114 may pass through chamber 118 and through vias 116 in wick layer 108. In embodiments, wick layer 108 may have a coefficient of thermal expansion (CTE) close to or approximating a CTE of die 102. Wick layer 108 may be disposed on a surface (e.g., on substrate side 124) in a die region and disposed over heat spreader in a heat spreader region.

In accordance with embodiments, heat generated by die may evaporate fluid absorbed by wick layer in the die region. The vapor may then transfer from the die region to the heat spreader region, and the evaporated fluid may condense in the heat spreader region. Wick layer 108 may return the condensed fluid from the heat spreader region to die region to complete the heat-transfer cycle. In some embodiments, wick layer 108 in the heat spreader region may be disposed on the heat spreader in a pattern to efficiently draw condensed fluid to die region. In embodiments, wick layer 108 may be comprised of differing porous materials (e.g., having different pore size and/or different porosity). For example, one type of wick material with a high liquid transfer rate may be meshed with another type of wick material with a high vapor condensation rate.

Phase-change fluid 120 may be one of many fluids suitable for changing state as part of a heat transfer process. Examples of suitable phase-change fluids include water, ethanol, acetone, methanol, flutec PP2, ammonia, propane, and various commercial refrigerants, such as R134a, R22 and R12 and including other halocarbon or hydrocarbon refrigerants. Phase-change fluid 120 is preferably non-corrosive with respect to the interconnects and a good insulator. Phase-change fluid 120 may be selected based on the desired temperature range of die 102 and its heat dissipation requirements, as well as other factors associated with package 100. In one embodiment, a phase-change fluid having a melting point of around 30 degrees Celsius may be used. Although phase-change fluid 120 is illustrated in FIG. 1 as a cloud or gas, it is understood that phase-change fluid 120 may be present in both gas and liquid form, and may be present chamber 118 as well as in wick layer 108.

Die 102 may be any die comprised of a semiconductor material such as silicon or gallium arsenide (GaAs). In embodiments, die 102 may incorporate material 103 having a dielectric constant (K) which may range from as great as 3.1 and as little as 1.5 or, which is lower than many materials found in conventional die which may have a dielectric constant that ranges from as great as 5 to as little as 3.5 In some embodiments, material 103 may be a dielectric film. In some embodiments, die 102 may be thinner than many conventional die and may have a thickness as low as 0.05 mm or less. The use of lower dielectric constant materials on die and/or thinner die may help improve performance at higher frequencies and data rates. The improved heat dissipation ability and reduced thermally-induced stress which may be achieved through the use of package 100 may allow the use of such die.

In embodiments, surface 124 of die 102 and surface 122 of the heat spreader may be substantially planar. Wick layer 108 may be disposed over these substantially planar surfaces of the die and the heat spreader. Thermal interface material 106 may be disposed between die 102 and heat spreader 104. Material 106 may fill any gap at locations 128 to provide a substantially planar surface between heat spreader 104 and die 102 to allow deposition of wick layer 108. Thermal interface material 106 helps provide for the transfer of heat from heat spreader side 126 of die 102 to heat spreader 104.

In embodiments, sealant 112 may be disposed between substrate 102 around a perimeter of heat spreader 104 to seal chamber 118. In embodiments, chamber 118 may be hermetically sealed. Sealant 112 may include a solder or polymer.

In embodiments, wick layer 108 may be an at least partially porous material and may be selected from one of spun-on glass, porous silicon, carbon fiber, sintered mesh powder, screen mesh, grooved metal and silicon. Wick layer 108 may be cured at an elevated temperature to increase porosity of the material. In embodiments, the elevated temperature may range between 200 and 400 degrees Celsius. Other examples of material suitable for use as wick layer 108 include porous metal films such as copper or aluminum. In embodiments, a material used for wick layer 108 may be selected based on its CTE to approximate the CTE of die 102. For example, when die 102 is a silicon based die, wick layer 108 may be comprised primarily of silicon.

Interconnects 114 may be compliant interconnects which may comply with their surrounding reducing stresses resulting from thermal expansion mismatch between die 102 and substrate 110. Interconnects 114 may include almost any interconnect structure, so long as it is compliant, and in some embodiments, may be formed by a lithographic process which may include a series of physical vapor deposition, electrolytic plating and etch steps. Examples of interconnects suitable interconnects 114 include microspring technology, sea-of-leads technology, silicon under bump technology, as well as others.

Figure 2:
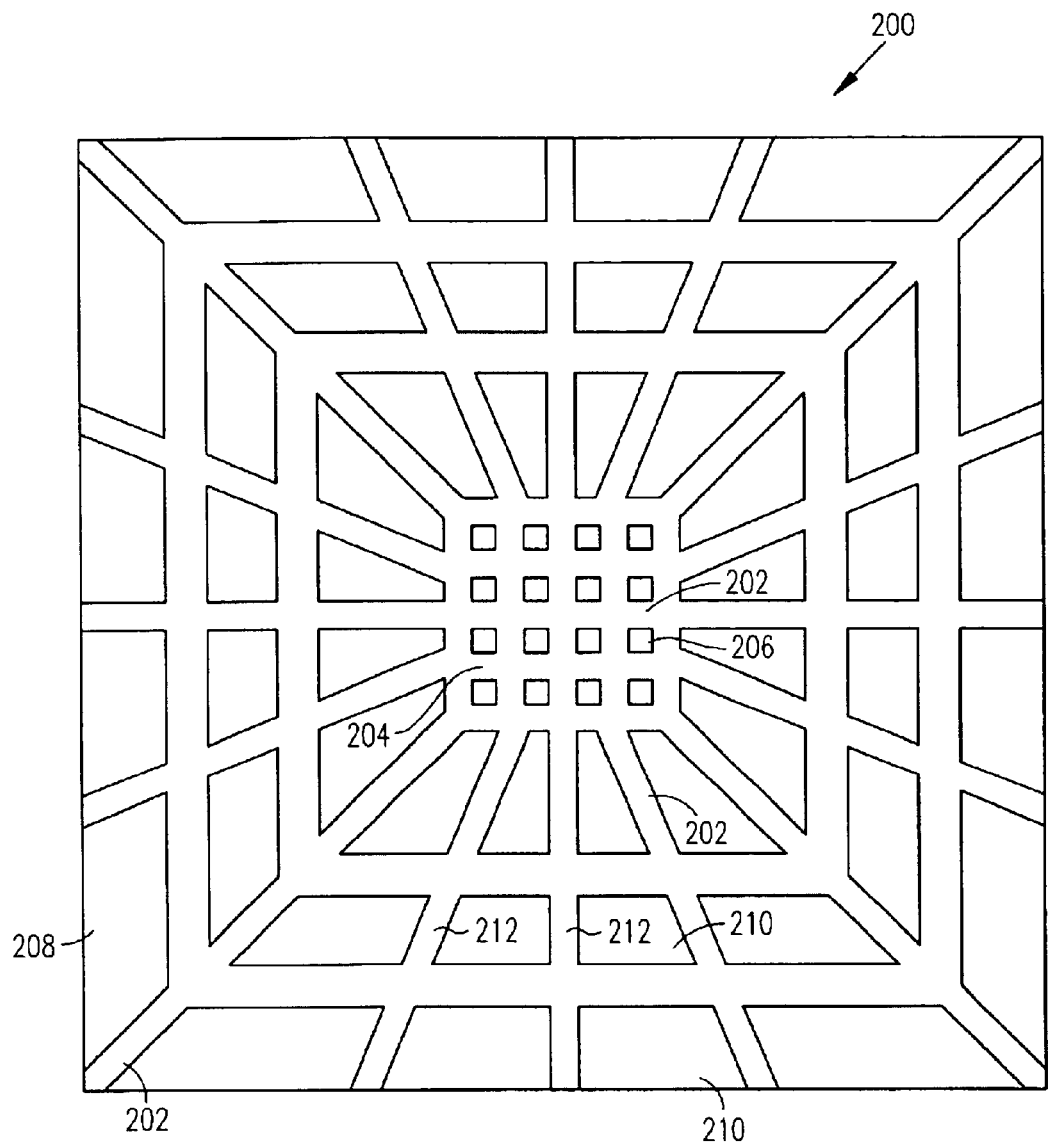
FIG. 2 is top view of a wick layer of a package in accordance with embodiments of the present invention.

FIG. 2 is top view of a wick layer of a package in accordance with embodiments of the present invention. Top view 200 illustrates wicking material 202 disposed in a pattern on the substrate side of a die and heat spreader. This pattern may be suitable for use for package 100 (FIG. 1) although other patterns are also suitable. Wicking material 202 may correspond with wick layer 108 (FIG. 1), and bond pads may correspond with the locations of vias 116 (FIG. 1). Wicking material 202 may be disposed on in die region 204 and etched to expose bond pads 206, only a few of which are illustrated. Die region 204 may serve as an evaporator in which phase-change fluid absorbed in wicking material 202 may be evaporated from the surface the die due to heat generated from the die. Wicking material 202 may also be disposed in heat spreader region 208 where the evaporated phase-change fluid may condense and return to die region 204. In embodiments, wicking material 202 may be disposed in heat spreader region 208 in a pattern to draw condensed phase-change fluid to the die region 204. The pattern of FIG. 2 illustrates wicking material 202 in heat spreader region 208 in a radial-like pattern; however other patterns are also suitable. In one embodiment, wicking material 202 may cover substantially all of the heat spreader in heat spreader region 208.

In some embodiments, heat spreader region 202 may have two or more types of wicking material disposed thereon. In these embodiments, a lower porosity wicking material may be used in regions 210, and a higher porosity wicking material may be used in regions 212. The higher porosity wicking material may allow the phase-change fluid to be more quickly drawn back to the die region 204, while the lower porosity wicking material may provide for improved condensation and thermal conductivity with the heat spreader below.

Figure 3:
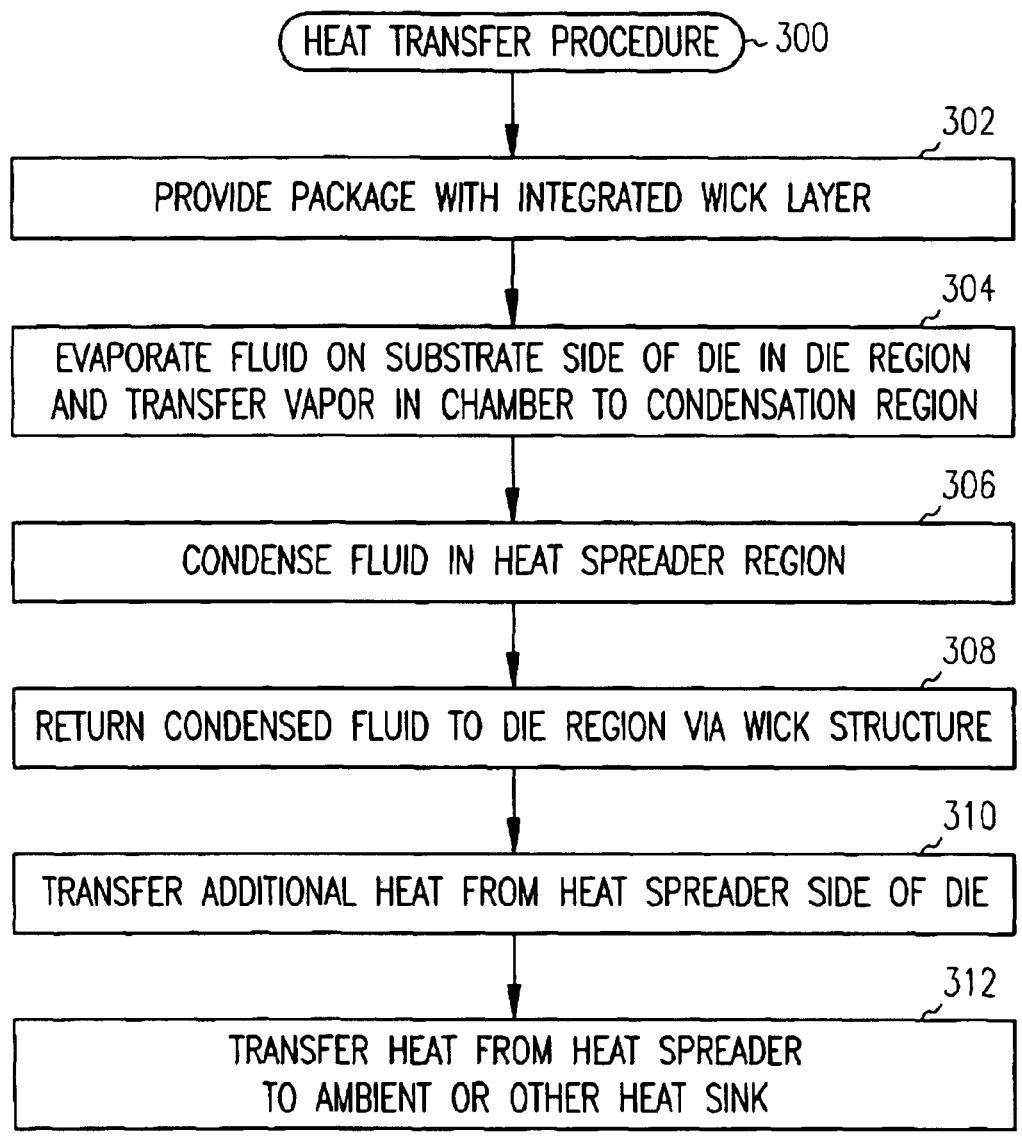
FIG. 3 is a flow chart of a heat transfer procedure in accordance with embodiments of the present invention.
Figure 4A:
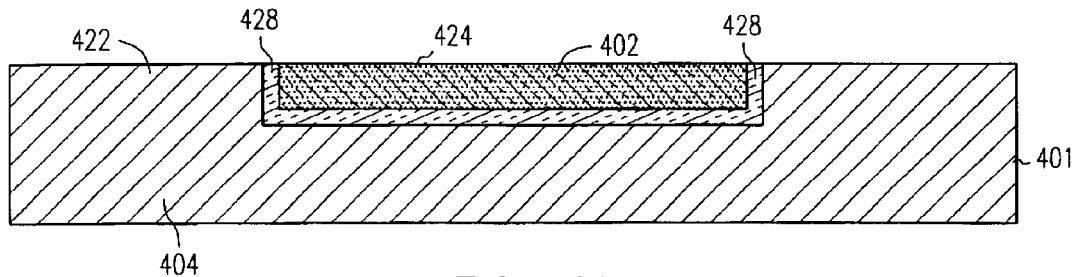
FIGS. 4A, 4B, 4C, 4D and 4E illustrate package fabrication in accordance with embodiments of the present invention.
Figure 4B:
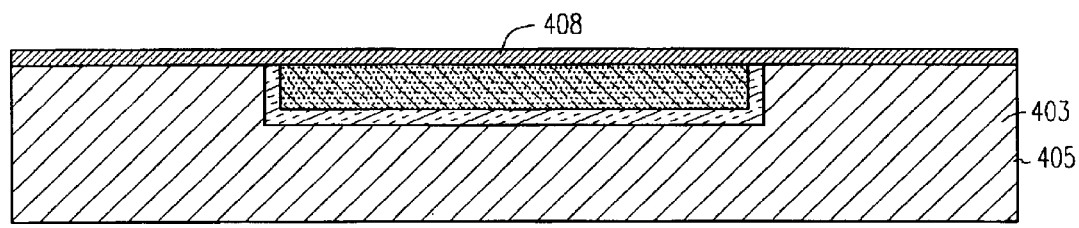
Figure 4C:
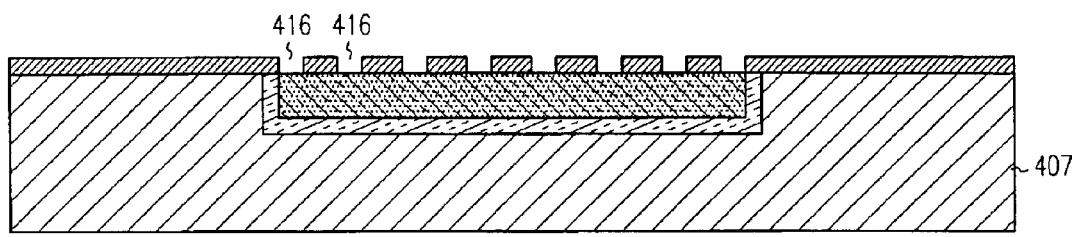
Figure 4D:
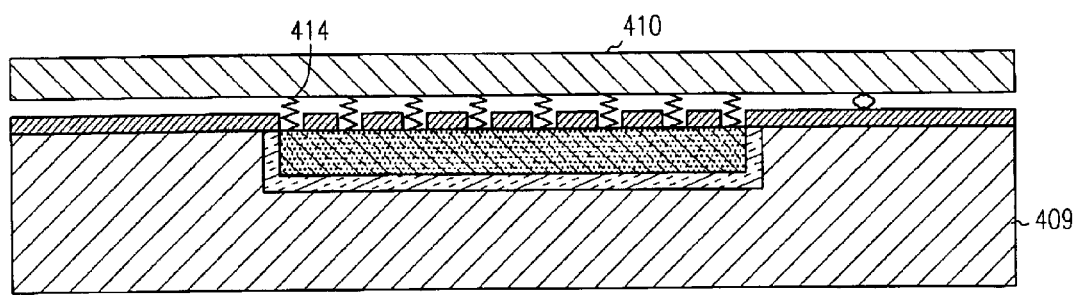
Figure 4E:
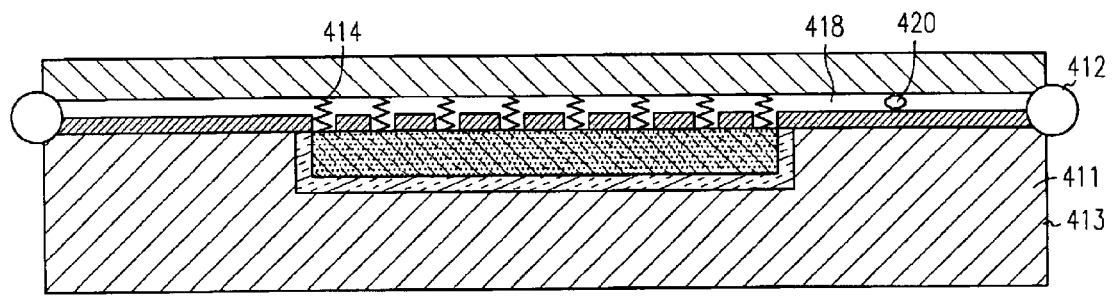

FIG. 3 is a flow chart of a heat transfer procedure in accordance with embodiments of the present invention. Heat transfer procedure 300 may be used to transfer heat from a die to a heat spreader. Procedure 300 may allow die to operate at higher frequencies and data rates, and may allow die to operate at higher power levels. Procedure 300 may also allow the use of thinner, lower dielectric constant (K) materials on die.

In operation 302, a package with an integrated wick layer is provided. The package may be similar to package 100 (FIG. 1) although other packages may also be suitable.

In operation 304, during operation of the die within the package, heat generated from the die evaporates a phase-change fluid from a die region and takes the latent heat from the phase change. The evaporated fluid is retained within a sealed chamber between the die and the substrate and transferred from the die region to the heat spreader region with lower temperature for condensation. The phase-change fluid may be evaporated from wicking material in the die region within the chamber.

In operation 306, the evaporated phase-change fluid may be condensed in a heat spreader region within the chamber and may be absorbed by wicking material disposed in the heat spreader region.

In operation 308, the condensed phase-change fluid may be returned to the die region through the wicking material as additional phase-change fluid is further evaporated in the die region to complete the cycle.

Operations 304 through 308 may operate on a continual basis during the operation of a die. Operations 304 through 308 remove heat from a substrate side of die which may be the side of the die in which more of the heat is generated. Accordingly, reduced die temperature can be achieved.

In operation 310, additional heat may be removed from the heat spreader side of a die. In operation 310, heat may be transferred through an interface material, such as interface material 106 (FIG. 1) from die 102 (FIG. 1) to heat spreader 104. In operation 312, the heat may eventually transfer to surrounding ambient via heat sink or the substrate/heat spreader surface.

Although the individual operations of procedure 300 are illustrated and described as separate operations, one or more of the individual operations may be performed concurrently and nothing requires that the operations be performed in the order illustrated. In addition, some of the operations of procedure may take place concurrently with other operations. For example, in some embodiments, operations 304 through 312 may take place concurrently, not sequentially.

FIGS. 4A, 4B, 4C, 4D and 4E illustrate package fabrication in accordance with embodiments of the present invention. FIGS. 4A, 4B, 4C, 4D and 4E may illustrate the fabrication of a package with an integrated wick layer, such as package 100 (FIG. 1) although other package fabrication techniques may be used to fabricate a package with an integrated wick layer. In embodiments, the fabrication process may be carried out at the wafer level making the interconnects and the wick layer together.

Figure 5:
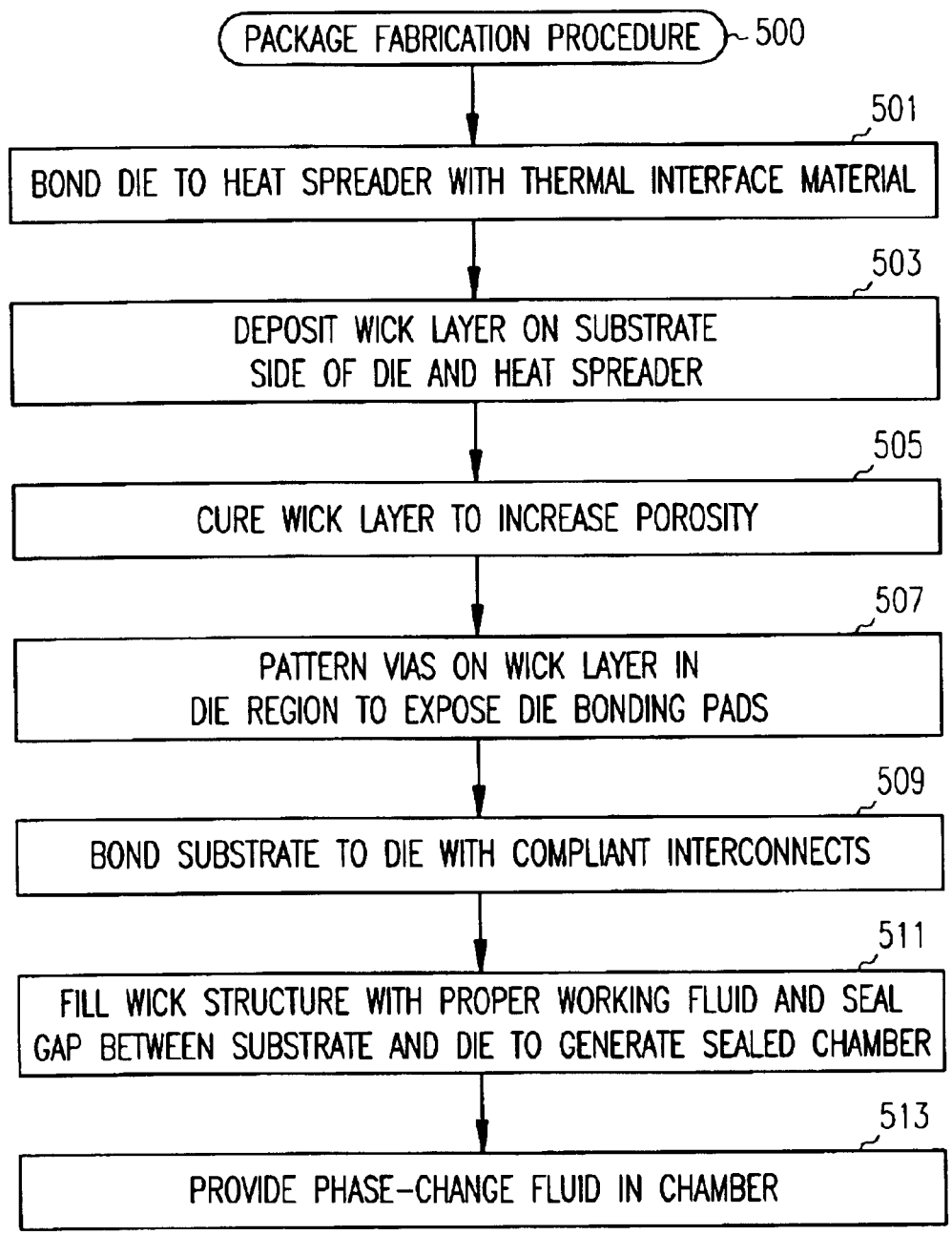
FIG. 5 is a flow chart of a package fabrication procedure in accordance with embodiments of the present invention.

FIG. 5 is a flow chart of a package fabrication procedure in accordance with embodiments of the present invention. Procedure 500 may be used to fabricate a package with an integrated wick layer, such as package 100 (FIG. 1) although other package fabrication procedures may be sued to fabricate a package with an integrated wick layer. Procedure 500 is described herein for the package fabrication steps 401, 403, 405, 405, 407, 409, 411 and 413 illustrated in FIGS. 4A, 4B, 4C, 4D and 4E.

In operation 501 corresponding with step 401, die 402 may be bonded to heat spreader 404 with thermal interface material 406. Surface 422 of the heat spreader and surface 424 of the die may aligned or substantially planar as illustrated. Thermal interface material 406 may be included to be planar with surfaces 422 and 424 at regions 428 to provide a substantially flat surface.

In operation 503, corresponding with step 403, wick layer 408 may be deposited over surfaces 422 and 424 including within regions 428. In operation 505, corresponding with step 405, the wick layer may be cured to increase its porosity. In embodiments, when more than one material is used for wick layer 408, operations 503 and 505 may be repeated for each type of wicking material. Cure temperatures may be based on a desired porosity of the wick layer.

In operation 507 corresponding with step 407, vias 416 may be patterned on wick layer 408 to remove the wicking material at least to expose bond pads in the die region. Vias 416 may be non-conductive holes through wick layer 408 and are distinguishable from plated-through vias. The bond pads may be associated with power pins and I/O pins of the die.

In operation 509, corresponding with step 409, substrate 410 may be bonded to the die with compliant interconnects 414 which are provided through vias 416 and thorough a gap between the substrate and the die. Compliant interconnects 414 may be formed through a series of evaporation and etch steps. In some embodiments, operation 509 may alternatively employ one of many die mounting techniques, which may employ either compliant or non-compliant interconnects. Other mounting techniques may include surface mounting techniques that use ball-grid arrays or solder.

In operation 511, corresponding with step 411, the wick layer may be filled with proper working fluid for phase change and then the gap between the substrate and die is sealed with sealant 412 to enclose or provide sealed chamber 418. In operation 513, corresponding with step 413, phase-change fluid 420 may be provided within the chamber. In some embodiments, operations 511 and 513 may be performed concurrently in which the phase-change fluid is added as the chamber is being sealed. Operation 513 may be omitted when the wick layer is filled with sufficient phase-change fluid in operation 511.

Although the individual operations of procedure 500 are illustrated and described as separate operations, one or more of the individual operations may be performed concurrently and nothing requires that the operations be performed in the order illustrated. In embodiments, the fabrication process may be carried out at the wafer level in which the interconnects and the wick layer are made together. In these embodiments, some of the operations of procedure 500 may be eliminated.

In embodiments, die 402 may correspond with die 102 (FIG. 1), heat spreader 404 may correspond with heat spreader 104 (FIG. 1), interface material 406 may correspond with interface material 106 (FIG. 1), wicking material 408 may correspond with wicking material 108 (FIG. 1), substrate 410 may correspond with substrate 110 (FIG. 1), sealant 412 may correspond with sealant 112 (FIG. 1), interconnects 414 may correspond with interconnects 114 (FIG. 1), vias 416 may correspond with vias 116 (FIG. 1), chamber 420 may correspond with chamber 120 (FIG. 1), phase-change fluid 420 may correspond with phase-change fluid 120 (FIG. 1), surfaces 422 and 424 may correspond respectively with surfaces 122 (FIG. 1) and 124 (FIG. 1), and region 428 may correspond with region 128 (FIG. 1).

Thus, an improved package and method have been described. The package and method may help reduce the temperature of a die. In embodiments, a package and method may help reduce stress on a die caused by thermal expansion mismatches. In embodiments, a package and method may increase the reliability of a die. In embodiments, a package and method may allow a die to operate at higher data rates. In embodiments, a package and method may be suitable for die having lower dielectric constant materials included therein.

The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, the invention embraces all such alternatives, modifications, equivalents and variations as fall within the spirit and scope of the appended claims.

What is claimed is:

1. A package comprising:

a wick layer between a die and a substrate; and a sealed chamber between the substrate and wick layer, the chamber having a phase-change fluid therein to transfer heat from a substrate side of the die to a heat spreader.

2. The package of claim 1 wherein a surface of the die and a surface of the heat spreader are substantially planar, and wherein the wick layer is disposed over the substantially planar surfaces of the die and the heat spreader, and wherein the fluid is a two-phase fluid which changes phase to transfer heat from the die to the heat spreader.

3. The package of claim 1 further comprising;

a thermal interface material disposed between the die and the heat spreader; and sealant disposed between the substrate and a perimeter of the heat spreader to seal the chamber.

4. The package of claim 1 further wherein the wick layer includes vias therethrough, and the package further comprises interconnects coupling bonding pads of the die to the substrate, at least some of the interconnects passing through the vias of the wick layer and the chamber to couple the bonding pads to the substrate.

5. The package of claim 1 wherein the wick layer is an at least partially porous material having a coefficient of thermal expansion approximating a coefficient of thermal expansion of the die.

6. The package of claim 1 wherein the wick layer is an at least partially porous material and is selected from one of spun-on glass, porous silicon, carbon fiber, sintered mesh powder, screen mesh, grooved metal and silicon.

7. The package of claim 1 wherein the wick layer is an at least partially porous material, the wick layer being cured at an elevated temperature to increase porosity of the material.

8. The package of claim 1 wherein the wick layer is etched to provide a predetermined pore size and porosity before application to the die and heat spreader.

9. The package of claim 1 wherein the wick layer is disposed on a surface of the die in a die region and disposed over the heat spreader in a heat spreader region, wherein heat generated by the die acts to evaporate fluid absorbed in the wick layer in the die region and to condense the evaporated fluid in the heat spreader region, the wick layer acts to return the condensed fluid from the heat spreader region to the die region.

10. The package of claim 9 wherein the wick layer in the heat spreader region is disposed on the heat spreader in a pattern to draw the condensed fluid to the die region.

11. The package of claim 9 wherein the wick layer is comprised of first and second porous materials wherein the second material has a lower porosity than the first material, the die region including the first material, the heat spreader region including at least the second material.

12. The package of claim 9 wherein the phase-change fluid transfers heat in the die region from a substrate side of the die to the heat spreader, and wherein heat generated by the die is also transferred to the heat spreader through a thermal interface material coupling a heat spreader side of the die to the heat spreader.

13. The package of claim 1 wherein the phase-change fluid is selected from one of either water, ethanol, acetone, methanol, flutec PP2, ammonia, propane, R134$a$, R22 and R12.

14. The package of claim 1 wherein the phase-change fluid is either a halocarbon or hydrocarbon refrigerant.

15. A package comprising:

a wick layer comprised of a porous material disposed between a die and a substrate, the wick layer having vias therethrough in a die region;

a sealed chamber between the substrate and wick layer, the chamber having a phase-change fluid therein to transfer heat from a substrate side of the die to a heat spreader; and interconnects to couple bonding pads of the die to the substrate, at least some of the interconnects passing through the wick layer to couple with the bonding pads of the die, the interconnects further passing through the sealed chamber to couple to the substrate.

16. The package of claim 15 wherein a surface of the die and a surface of the heat spreader are substantially planar, and wherein the wick layer is disposed over the substantially planar surfaces of the die in the die region and being disposed over the substantially planer surface of the heat spreader in a heat spreader region.

17. The package of claim 16 wherein heat generated by the die to evaporate fluid absorbed in the wick layer in the die region, the evaporated fluid to condense in the heat spreader region, the wick layer to return the condensed fluid from the heat spreader region to the die region.

18. The package of claim 17 wherein additional heat is transferred from a heat spreader side of die to the heat spreader through a thermal interface material coupling the die to the heat spreader.

19. The package of claim 18 further comprising;

a thermal interface material disposed between the die to the heat spreader to transfer the additional heat; and a sealant disposed between the substrate and the heat spreader to seal the chamber.

* * * * *

UNITED STATES PATENT AND TRADEMARK OFFICE
CERTIFICATE OF CORRECTION

PATENT NO. : 7,095,111 B2  
APPLICATION NO. : 10/403645  
DATED : August 22, 2006  
INVENTOR(S) : Hu et al.

Page 1 of 1

It is certified that error appears in the above-identified patent and that said Letters Patent is hereby corrected as shown below:

In column 7, line 30, in Claim 4, before "wherein" delete "further".

Signed and Sealed this

Fifth Day of December, 2006

JON W. DUDAS  
*Director of the United States Patent and Trademark Office*